(12) United States Patent
Jeter et al.

(10) Patent No.: US 9,640,244 B1
(45) Date of Patent: May 2, 2017

(54) PRE-CALIBRATION FOR MULTIPLE PERFORMANCE STATES

(71) Applicant: Apple Inc., Cupertino, CA (US)

(72) Inventors: Robert E. Jeter, Santa Clara, CA (US); Rakesh L. Notani, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/083,786

(22) Filed: Mar. 29, 2016

(51) Int. Cl.
*G11C 29/04* (2006.01)
*G11C 11/4076* (2006.01)
*G11C 11/4096* (2006.01)

(52) U.S. Cl.
CPC ...... *G11C 11/4076* (2013.01); *G11C 11/4096* (2013.01)

(58) Field of Classification Search
CPC ........................................................ G11C 29/04
USPC ....................................................... 711/154
See application file for complete search history.

(56) References Cited

U.S. PATENT DOCUMENTS

| | | | |
|---|---|---|---|
| 6,281,818 B1 | 8/2001 | Miller | |
| 6,665,624 B2 | 12/2003 | Simon | |
| 6,804,620 B1 | 10/2004 | Larson | |
| 7,602,859 B2 | 10/2009 | Cheng | |
| 2004/0181731 A1* | 9/2004 | Rajsuman | G06F 11/273 714/747 |
| 2005/0210308 A1* | 9/2005 | Best | G11C 29/02 713/503 |
| 2005/0265437 A1* | 12/2005 | Yeung | G11C 7/20 375/224 |
| 2008/0252332 A1* | 10/2008 | Lee | H03K 19/0002 326/30 |
| 2013/0262791 A1* | 10/2013 | Henderson | G06F 1/324 711/154 |
| 2013/0346721 A1 | 12/2013 | Giovannini | |
| 2014/0062551 A1* | 3/2014 | Bhaumik | H03L 7/0805 327/158 |

* cited by examiner

*Primary Examiner* — Min Huang
(74) *Attorney, Agent, or Firm* — Meyertons, Hood, Kivlin, Kowert & Goetzel, P.C.; Erik A. Heter (57) ABSTRACT

A method and apparatus for pre-calibration of various system performance states is disclosed. In one embodiment, a method includes, for each of a number of different performance states (or operating points), performing initial calibrations of various parameters associated with transfers of data between a memory and a memory controller. After completing the initial calibrations, the calibrated values are stored. Thereafter, during normal operation and following a change to a new performance state, the values of the various parameters are set to the values to which they were calibrated during the initial calibration for that state.

17 Claims, 5 Drawing Sheets

PRE-CALIBRATION FOR MULTIPLE PERFORMANCE STATES

BACKGROUND

Technical Field

This disclosure is directed to memory subsystems, and more particularly, calibration of signals conveyed in memory subsystems.

Description of the Related Art

Eye patterns, or eye diagrams, are graphic illustrations that illustrate times and amplitudes at which a digital signal can be sampled at its correct value. In various types of systems that include data transmissions, sampling of signals (based on a clock signal) near a center of an eye, in terms of time, may be desirable. This may provide a signal with a sufficient amount of both setup and hold time, while also rendering it less susceptible to noise. In sampling a signal, a threshold voltage is used to determine whether the signal is interpreted as a logic 0 or a logic 1.

In memory systems, calibrations may be performed to determine the points at which signals are sampled within the eye pattern. Calibrations may be performed to determine both the point in time at which signals are sampled, as well as to determine the threshold voltage for distinguishing between logic 0's and logic 1's. Performing these calibrations typically includes adjusting a number of different parameters that govern transmission of data between a memory controller and a memory. Such calibrations may be performed on a periodic basis. Additionally, since some systems have multiple operating points (e.g., combinations of clock frequency and supply voltage), calibrations may also be performed upon a switch from one operating point to another.

SUMMARY

A method and apparatus for pre-calibration (i.e. prior to beginning normal operation and allowing normal memory traffic) of various system performance states is disclosed. In one embodiment, a method includes, for each of a number of different performance states (or operating points), performing initial calibrations of various parameters associated with transfers of data between a memory and a memory controller prior to commencing normal operation. After completing the initial calibrations, the calibrated values are stored. Thereafter, during normal operation and following a change to a new performance state, the values of the various parameters are set to the values to which they were calibrated during the previous calibration for that state.

Upon a change of performance state subsequent to the pre-calibration, parameter values may be restored to their values obtained from the results obtained during the pre-calibration. The calibrated parameter values may also undergo voltage and temperature (VT) scaling after entering the performance state to account for differences between current operating conditions and the operating conditions under which the calibrations were performed. In particular, since there may be differences between a current operating voltage and current temperature relative to voltage and temperature values that were present during the initial calibration for that performance state, VT scaling may adjust parameter values to account for such differences. After performance of VT scaling, a quick calibration of at least a subset of the parameters may be performed.

In one embodiment, the various parameters calibrated include a reference voltage used to distinguish a logic zero from a logic one, and a delay applied to a data strobe signal that is used to synchronize transfers of data between the memory and the memory controller. Other parameters may be calibrated as well (e.g., a code applied to a delay locked loop associated with the data strobe signal). At least one of the performance states for which initial calibrations are performed may include active on-die termination. The on-die termination may be inactive for at least one other performance state.

In one embodiment, a memory controller includes a calibration control unit that controls performance of the various calibrations. The calibration control unit may also include storage used to store the calibration results for each of the performance states. The calibration control unit may be coupled to a power management circuit that controls the performance states and changes there between in the system in which the memory controller is implemented. Responsive to receiving an indication of a pending performance state change, the calibration control unit may provide the calibrated parameter values corresponding to the new state, which may then be set in the memory controller upon entering the new state.

BRIEF DESCRIPTION OF THE DRAWINGS

The following detailed description makes reference to the accompanying drawings, which are now briefly described.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," oilier components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. An "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. §112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

Figure 1:
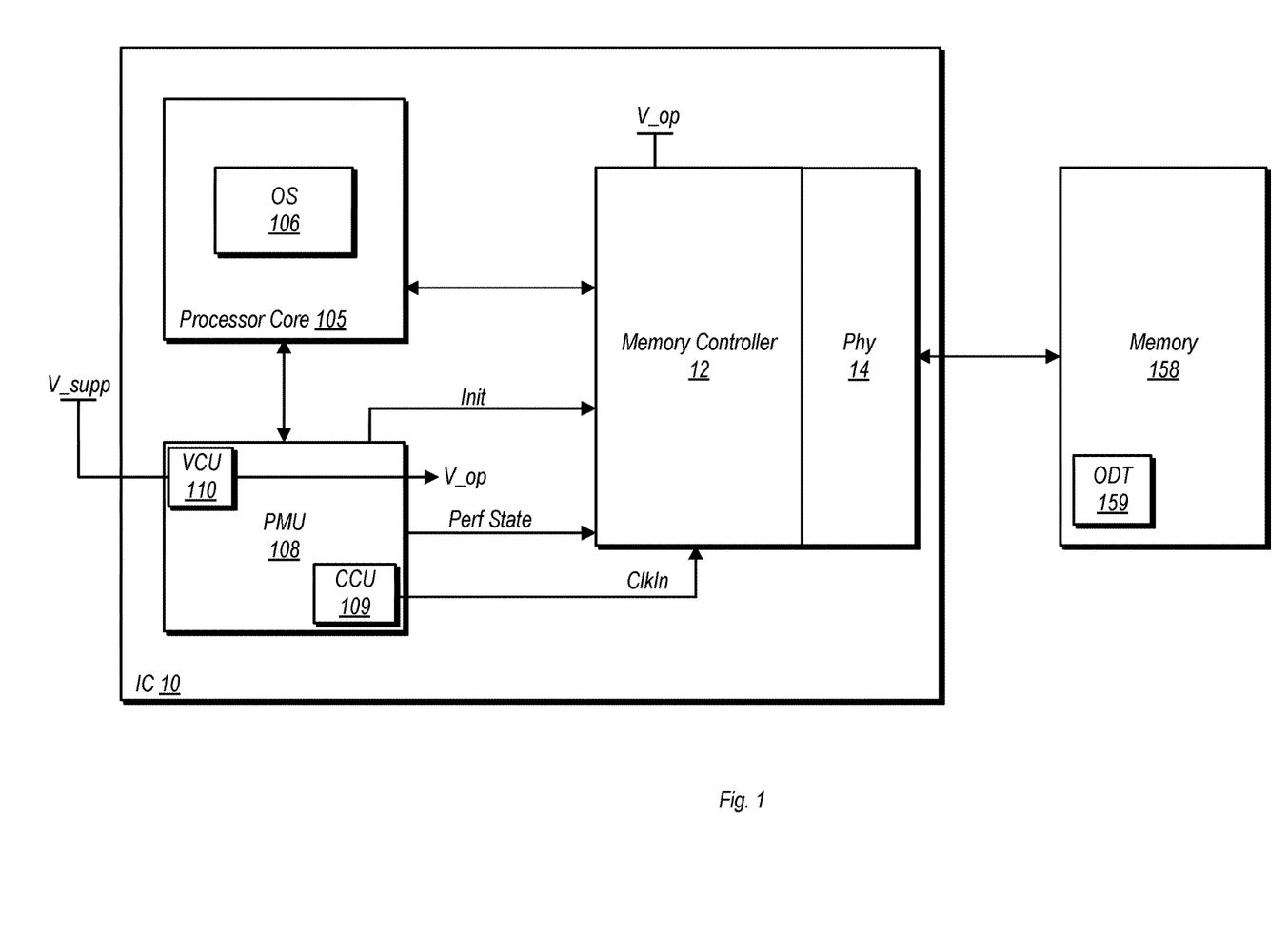
FIG. 1 is a block diagram of one embodiment of an integrated circuit and a memory coupled thereto.

FIG. 1 is a block diagram of one embodiment of an integrated circuit (IC). IC 10 is shown here as a simplified block diagram including various units/circuits implemented thereon. However, other embodiments are possible and contemplated, and may include additional circuits/units not shown here or explicitly discussed herein.

In the embodiment shown, IC 10 is coupled to a memory 158. In one embodiment, memory 158 is a dynamic random access memory (DRAM), although the scope of this disclosure is not limited to DRAM.

IC 10 in the embodiment shown includes at least one processor core 105, although multiple instances of the same may be present. Processor core 105 is configured to execute software instructions, including those of operating system (OS) 105. The instructions of OS 105 may, when executed, cause various system management functions to be performed, such as memory allocation, performance state changes, and so forth.

IC 10 also includes a power management unit (PMU) 108 in the illustrated embodiment. PMU 108 may implement circuitry that performs various power control functions, such as operating voltage changes, power gating, clock frequency changes, and clock gating. These power control functions may be performed in conjunction with performance state changes. Such performance state changes may be put into effect via execution of instructions of OS 105 or through other mechanisms within PMU 108 itself. A performance state (which may also be referred to herein as an operating point) may be defined as combination of an operating voltage and clock frequency. These parameters may be adjusted for desired performance and power savings. For example, if high performance is desired at a given time during operation, the clock frequency and/or the operating voltage may be increased. If reducing power consumption is prioritized at a given time during operation, the clock frequency and/or supply voltage may be reduced. In general, PMU 108 may adjust the clock frequency and operating voltage may be adjusted during operation in an attempt to optimize the amount of performance achieved per watt of power consumed.

PMU 108 in the illustrated embodiment includes a clock control unit (CCU) 109. A clock signal, ClkIn, may be provide from CCU 109 to a memory controller 12 of IC 10. This clock signal may be generated internal to CCU 109, or by other clock generation circuitry external thereto.

PMU 108 in the embodiment shown also includes a voltage control unit (VCU) 110. An external supply voltage, V_supp, is provided to VCU 110. Circuitry within VCU 110 may adjust the voltage output therefrom, V_op, which is the operating voltage supplied to memory controller 12, among other places. PMU 108 may accomplish performance state changes by adjusting the frequency of the clock output from CCU 109, Memory controller 12, which includes physical interface (PHY) 14, provides an interface between processor core 105 and memory 158. Although not explicitly shown, IC 10 may also include one or more units of interface circuitry that are also coupled to memory controller 12. Accordingly, memory controller 12 may provide an interface for one or more circuits external to IC 10 and memory 158.

During operation, memory controller 12 may operate in a number of different performance states. The different performance states may in turn utilize different frequencies for ClkIn with respect to one another, and different operating voltages as well. In some embodiments, the decision to change the performance state may be made by OS 106. In other embodiments, the decision may be made by PMU 108. In either case, PMU 108 may provide an indication ('Perf State') that a performance state change is pending. Memory controller 12 may use the information of the pending clock frequency change to perform certain actions. Among these action, as is discussed below, is to set certain parameters to pre-calibrated values upon entry into the new state.

Memory 158 in the embodiment shown includes on-die termination (ODT) control circuitry 159 that may activate on-die termination for various signals received from memory controller 12. In one embodiment, the activation of ODT may be dependent upon the performance state, and thus ODT control circuitry 159 may be coupled to receive indications of a performance state change. The state of the ODT, active, or inactive, may affect various operating parameters, such as delays in certain signal paths. This may in turn affect the calibrated values of certain parameters. In embodiments discussed below, pre-calibrations, or initial calibrations, may be performed for the various performance states, including those in which ODT is active.

Figure 2:
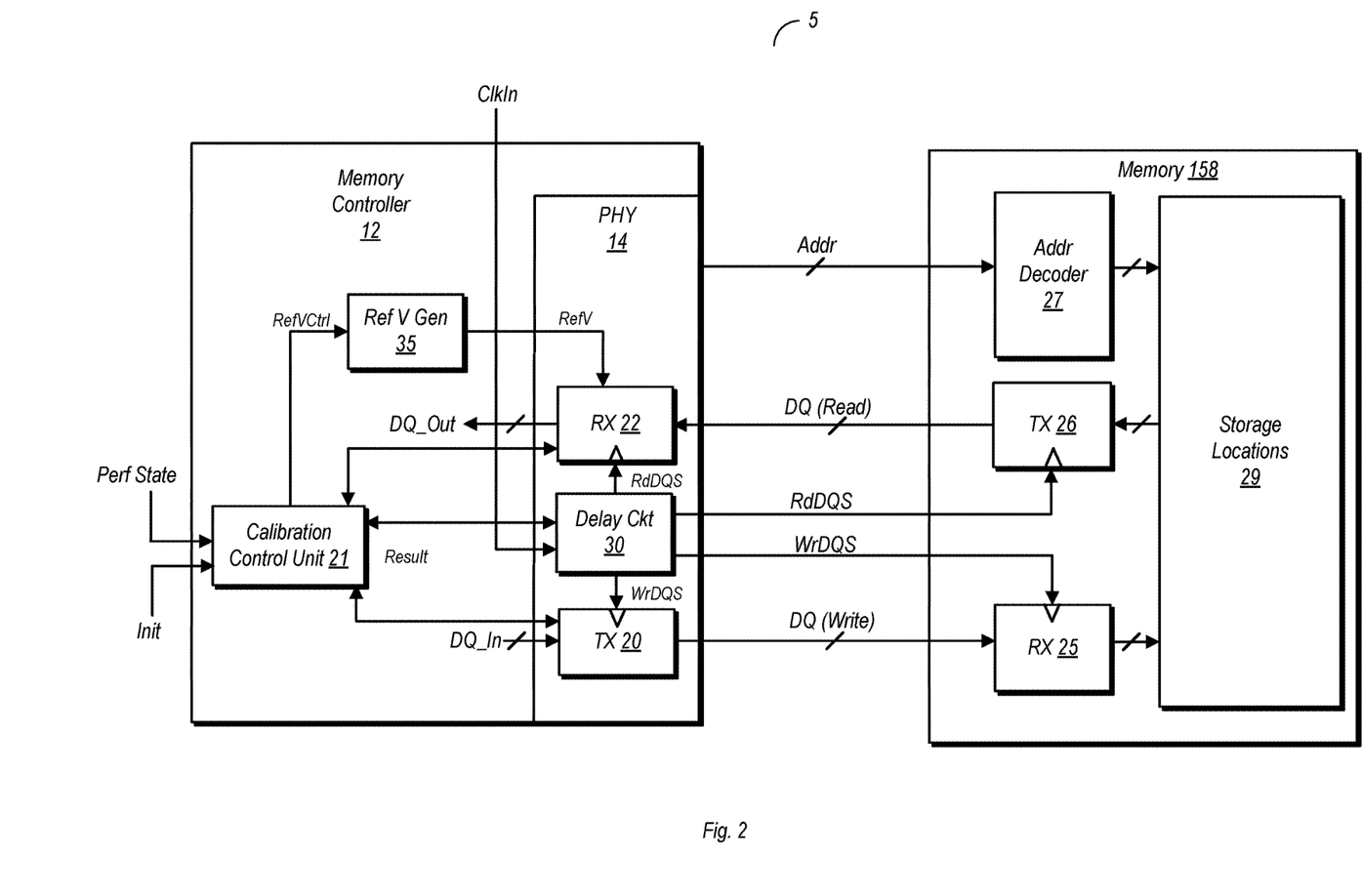
FIG. 2 is a block diagram of one embodiment of a memory subsystem.

Turning now to FIG. 2, a block diagram of a system having a memory controller and a memory is shown. In the embodiment shown, system 5 includes a memory controller 12 and a memory 158. The memory controller 12 includes a physical layer 14 which is used for interfacing with memory 158. The physical layer 14 includes a receiver 22 configured to receive data read from memory 158, and a transmitter 20 configured to transmit data to memory 158. Memory 158 includes an address decoder 27, a number of storage locations 29, a receiver 25 configured to receive data to be written and a transmitter 26 configured to transmit data that has been read. Although not explicitly shown, memory 158 may include additional logic for receiving read and write enable signals, with such logic being configured to enable selected storage locations for read and write operations, respectively. Additionally, memory controller 12 in the embodiment shown includes control logic 21, which may perform various functions, including conducting various embodiments of a calibration method discussed below.

Physical layer 14 includes a delay circuit 30 that is coupled to receive an input clock signal ('Clk'). In the embodiment shown, delay circuit 30 may include two separate paths to apply delays to the input clock signal to generate a read data strobe ('RdDQS') and a write data strobe ('WrDQS'). For example, one embodiment of delay circuit 30 may include a pair of delay locked loops (DLLs), one configured to output the read data strobe and one to output the write data strobe. The delays of the respective DLL's may be set according to control signals generated elsewhere in memory controller 12, e.g., in control logic 21. Types of delay circuits other than DLL's are also possible and contemplated for various other embodiments.

Delay circuit 30 may provide the read data strobe to receiver 22 in physical layer 14, as well as to transmitter 26 in memory 158. The read data strobe signal may be used in synchronizing reads of memory 158. The write data strobe may be provided to transmitter 20 of physical layer 14, along with receiver 25 of memory 158. Accordingly, the write data strobe may be used in synchronizing writes to memory 158.

Memory 158 in the embodiment shown includes an address decoder 27 coupled to receive an address from physical layer 14 of memory controller 12. Address decoder 27 may decode the received address to enable particular ones of the storage locations 29 that are to be enabled for a current memory operation. Addresses may be provided from physical layer 14 of memory controller 12 for both read operation and write operations.

The data strobe signals provided by delay circuit 30 may be subject to inherent delays, particularly on the side of memory 158. Since the clock edges of the data strobe signals are used to validate data received from memory controller 12 when received by receiver 25 at memory 158, as well as to validate data transmitted from transmitter 26 of memory 158, it is important that setup and hold time requirements for both are observed. Moreover, the data strobe signals used herein are used to synchronize the sampling of multiple bits. Furthermore, the signal paths for conveying bits between memory controller 12 and memory 158 may each be subject to their own unique delays, and thus some inter-lane skew may be present among the data bits. It is desirable that each data signal be sampled at or near the center of a window that may be depicted by an eye diagram. Accordingly, procedures to calibrate the data strobe signals to compensate for inherent delays may be performed at certain times during operation of memory controller 12 in order to optimize the point in time at which the data strobe signals sample data. The calibration procedures may be conducted under the control of calibration control unit 21, and involved performing a number of reads of from memory along with adjustments of an amount of delay applied to the data strobe signal being calibrated. The calibration of the data strobe delay may be performed periodically, and may sometimes be referred to as a horizontal calibration.

A reference voltage calibration may also be performed under the control of control logic 21. The reference voltage may be that voltage that is used to distinguish between a logic 0 and a logic 1. Over time, due to process, voltage, and temperature variations, the reference voltage may need to be calibrated. This calibration may also be performed periodically, and may sometimes be referred to as a vertical calibration. Based on the calibration, control logic 21 may set the reference voltage at reference voltage generator 35 using the signal RefVCtrl. The reference voltage, RefV, or an indication of the same, may be provided from reference voltage generator 35 to receiver 22.

In calibrating the data strobe signal delays and the reference voltages, other parameters may also require calibrations. For example, the DLLs implemented in one embodiment of delay circuit 30 may operate based on codes that set the delays applied to the data strobe signals. Due to process, voltage, and temperature variations, a code to provide a certain amount of delay may vary. Thus, calibration of the code may become part of the delay calibration. Other parameters to be calibrated may include impedances, training of read gates, and so forth. As noted above, ODT may be active for some performance states, and as such, can affect the parameters for which calibration is performed. In general, calibrations may be performed for any controllable parameter that can affect the transfer of data between memory control 12 and memory 158.

In order to allow more efficient transition from one performance state to the next, calibration control unit 21 may perform calibrations of each of the different performance states. That is, prior to beginning normal operations, calibrations of each of the parameters that can be calibrated may be performed for each of the different performance states. In the illustrated example, calibration control unit 21 is coupled to receive, from PMU 108 an initialization signal, 'Init', indicating that it is to perform the pre-calibrations. Indications of the performance state may also be received from PMU 108. Based on the received performance state information, calibration control unit 21 may cause the various parameters to be calibrated for that state, with the calibrated values then stored for later use. PMU 108 may cause transitions through the various performance states, with calibration control unit calibrating the parameters and storing values for each one. Once parameters have been calibrated for all performance states (including states in which ODT is active as well as those in which it is not), PMU 108 may de-assert the initialization signal. Thereafter, calibration control unit may set the calibrated parameters to values corresponding to the performance state indicated by PMU 108. Upon a change to a new performance state, calibration control unit may set the parameters to values corresponding to those obtained during the previous calibration performed for that state. Thus, rather than performing new calibrations for each parameter upon entering a new state, known parameter values obtained from the pre-calibrations may be used instead. This may allow operation in the new performance state to commence faster than would otherwise be possible if all parameters were re-calibrated.

It is noted, however, a subset of the parameters, or shorter calibrations may be performed upon entering a new performance state. However, these calibrations may consume significantly less time than that required to perform full calibrations of all parameters, and thus their effect on performance may be small, if not negligible.

Figure 3:
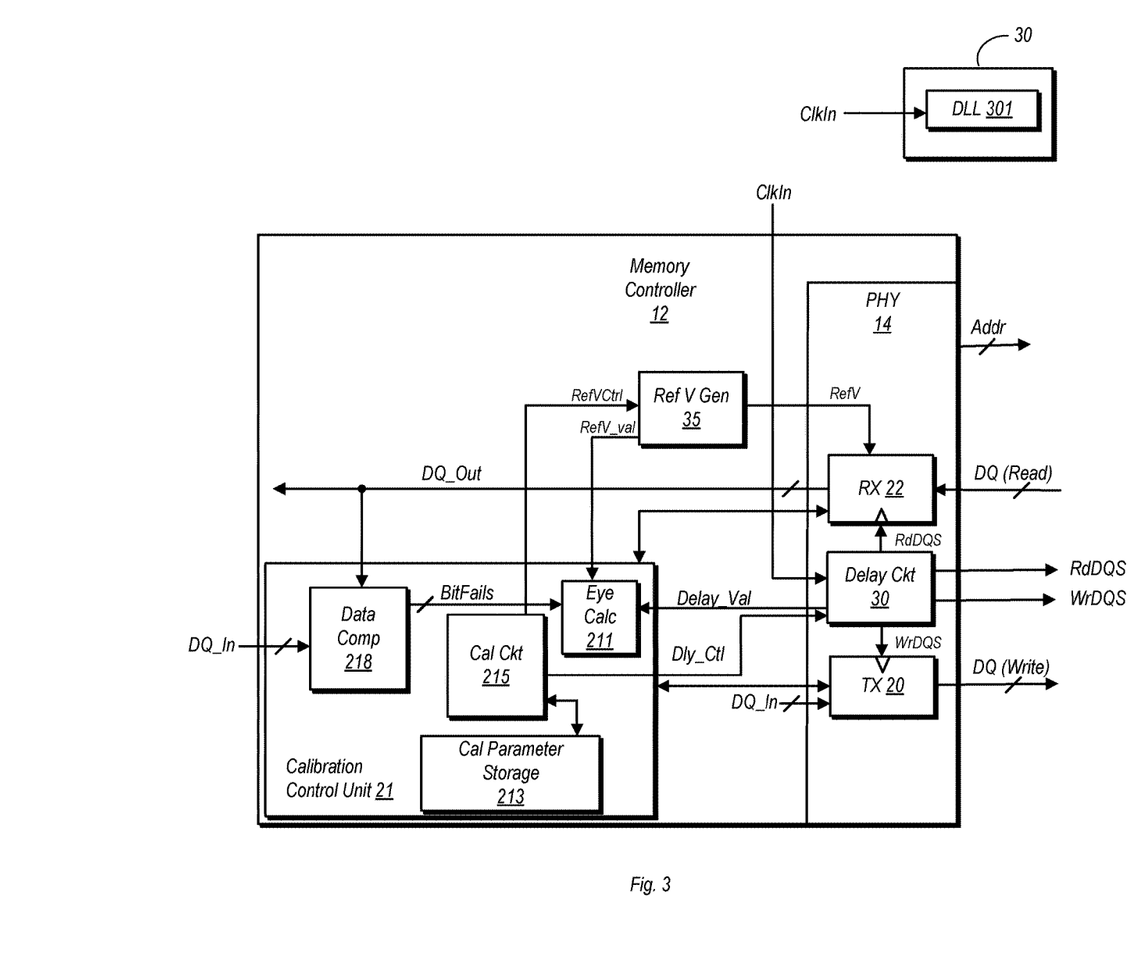
FIG. 3 is a block diagram illustrating one embodiment of a memory controller having a calibration control unit.

Turning now to FIG. 3, a block diagram illustrating one embodiment of a memory controller having a calibration control unit is illustrated. In the embodiment shown, calibration control unit 21 includes a calibration circuit 215, a calibration parameter storage unit 213, and a data comparator unit 218. Calibration circuit 215 is configured to control the reference voltage value via the RefV_val signal provided to reference voltage generator 35. Similarly, calibration circuit 215 may also control the delay value applied to the data strobe signals via the Dly_Ctl signal provided to delay circuit 30. Memory controller 12 also includes a reference voltage generator 35 which is configured to generate the reference voltage used to distinguish a logic zero from a logic one on data read from the memory. The physical interface 14 of memory controller 12 includes a receiver 22, which is coupled to receive data from memory on reads therefrom, and a transmitter 20 configured to transmit data to memory on writes thereto. Also included in physical interface 14 is a delay circuit 30, which is used to provide and control delay applied to the read data strobe signal (RdDQS) and write data strobe signal (WrDQS) during reads and writes, respectively. Delay circuit 30 includes at least one delay locked loop (DLL) 301, and may also include additional DLL's and other circuitry for controlling the delays applied to the read and write data strobes. Calibrating the delay applied to the data strobe signal may include determining/calibrating a code provided to a DLL which is used in setting the delay.

The various calibrations performed may include performing writes of data to memory and subsequently reading that data back from memory. The data that is read from memory may be compared to that which was written to memory to determine and discrepancies between the two. The comparisons may be performed by data comparator 218, which is coupled to receive data to be written to the memory via the DQ_In input and data read from memory via the DQ_Out input (the latter via receiver 22). For each cycle of data ready from the memory, data comparator 218 may report any failing bits to eye calculation circuit 211. Eye calculation circuit in the embodiment shown is coupled to receive a delay value from delay circuit 30 and a reference voltage value from reference voltage generator 35 during each read of data from memory conducted during a calibration procedure. Based on the parameter settings used during the calibration and the record of failures, eye calculation circuit 211 may calculate eye diagrams for each bit read from memory. This may in turn provide information used in determining the calibrated parameter values (e.g., the delay applied to a data strobe) that determine the width of an eye diagram, and thus factors such as optimal setup and hold times for sampling each bit upon its receipt from memory.

Calibration circuit 215 is coupled to save calibrated parameter values for each set of calibrations in calibration parameter storage 213. This storage may be implemented using any suitable type of memory, such as registers, flash memory, and so on. During normal operation, and responsive to a performance state change, calibration circuit 215 may read the parameters corresponding to the new performance state from calibration parameter storage 213, and subsequently set the parameters to the correspondingly read value.

Figure 4:
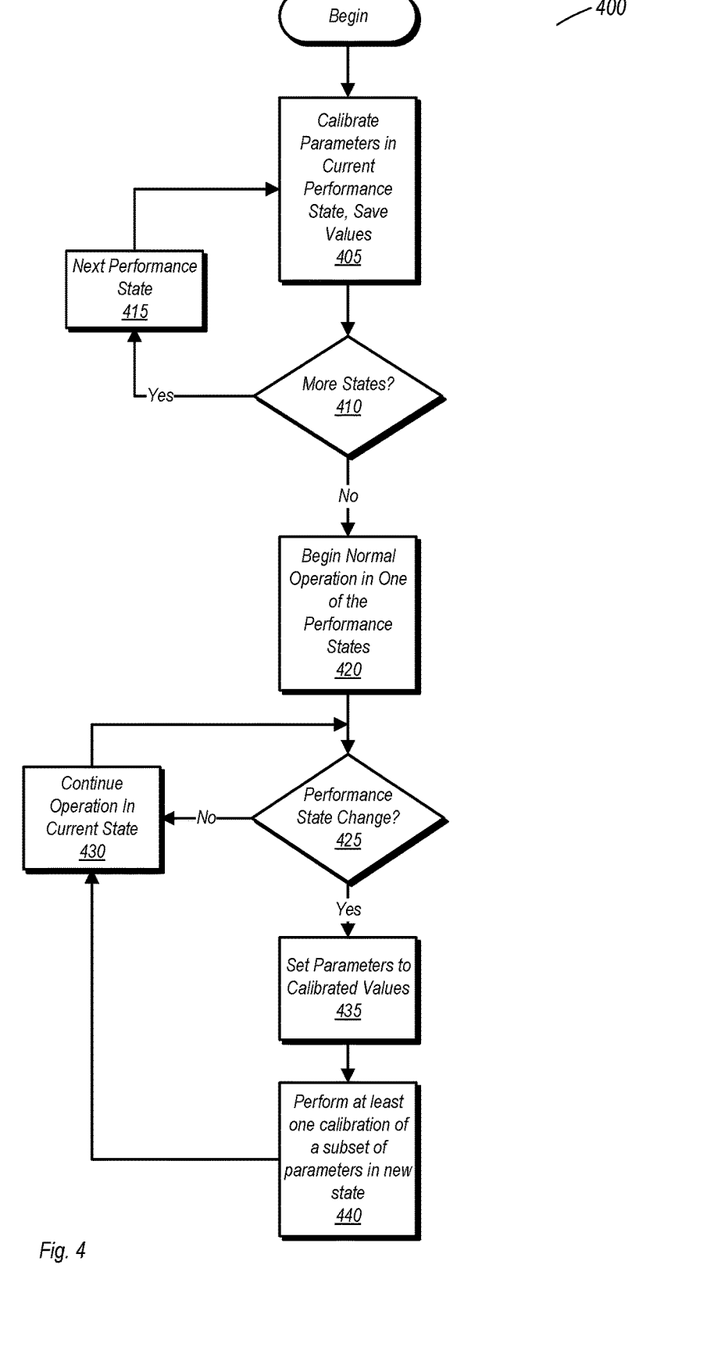
FIG. 4 is a flow diagram illustrating one embodiment of a method for performing pre-calibrations of a memory subsystem.

FIG. 4 is a flow diagram of one embodiment of a method for performing pre-calibrations of a memory subsystem. Method 400 may be performed on any of the various apparatus/hardware embodiments discussed above. Apparatus/hardware embodiments not explicitly discussed herein that are capable of performing method 400 are also possible and contemplated, and thus fall within the scope of this disclosure. It is also possible and contemplated that at least portions of method 400 are performed by software and/or firmware, in conjunction with any hardware that may also be used in carrying out the method.

Method 400 contemplates a pre-calibrations that begins prior to beginning normal operations. In the system in which the method is carried out, calibrations of a number of different parameters associated with data transfers. The calibrations may be performed in a first performance state, with the resulting calibrations values being saved (block 405). If full calibrations need to be performed for more states (block 410, yes), the apparatus is transitioned to the next performance state (block 415). After the transition, the calibrations are performed again in the new performance state (block 405). Generally speaking, the loop including blocks 405, 410, and 415 may be repeated multiple times and may include performing a full set of calibrations for at least one state in which ODT is active and at least one other state in which ODT is not active. If there are no more performance states for which a full set of calibrations has not been performed (block 410, no), then normal operation commences in one of the performance states (block 420).

If a performance state change is indicated (block 425, yes), then upon changing to the new performance state, the parameters are set to their previously obtained calibrated values (block 435). Voltage and temperature (VT) scaling may be performed in conjunction with the setting the parameters to their previously calibrated values. In particular, the VT scaling may account for differences between the current operating conditions (voltage and temperature) and those present at the time calibration was performed. At some point subsequent to entering a new performance state, at least a subset of the parameters may be calibrated again (block 440). The calibration of the subset of parameters, generally speaking, may be performed in less time that that consumed by performing a full calibration of all parameters. Normal operation may then continue in the current performance state (block 430). Furthermore, in the absence of any performance state change (block 425, no), operation will continue in the current performance state.

Figure 5:
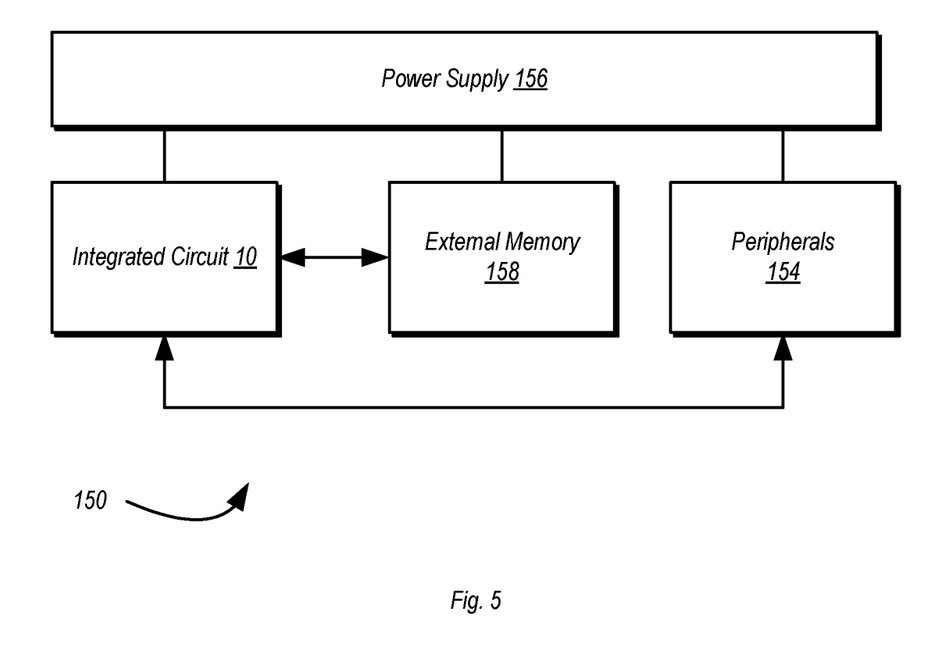
FIG. 5 is a block diagram of one embodiment of a system.

Turning next to FIG. 5, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A method comprising:
performing a plurality of calibrations of a memory subsystem at each of a plurality of operating points, wherein each of the plurality of calibrations includes calibrating a delay of a data strobe signal conveyed from a memory controller to a memory in the memory subsystem, and further includes calibrating a reference voltage used to distinguish between a logic one and a logic zero;
saving calibration state data for each of the plurality of calibrations, wherein each calibration state includes the delay of the data strobe signal and the reference voltage for the corresponding one of the plurality of operating points;
responsive to changing to a given one of the plurality of operating points, setting the delay of the data strobe signal and the reference voltage to respective values of the calibration state corresponding to the given one of the plurality of operating points; and
performing a next calibration subsequent to changing to the given one of the plurality of operating points, wherein the next calibration comprises calibrating a subset of the plurality of parameters for which calibration was performed during each of the plurality of calibrations.

2. The method as recited in claim 1, wherein the memory subsystem includes a memory controller coupled to a memory, wherein performing each of the plurality of calibrations includes the memory controller writing data to memory and reading data from memory.

3. The method as recited in claim 2, wherein performing each of the plurality of calibrations includes calibrating a delay applied to a data strobe signal conveyed from the memory controller to the memory.

4. The method as recited in claim 3, wherein calibrating the delay applied to the data strobe signal includes determining a code for a delay locked loop.

5. The method as recited in claim 2, wherein performing the calibrations includes calibrating a reference voltage used to distinguish a logic one from a logic zero on bits of data read from the memory.

6. The method as recited in claim 1, further comprising performing a next calibration of the memory subsystem at a time subsequent to entering a new performance state.

7. The method as recited in claim 6, wherein performing each of the plurality of calibrations includes performing a first number of calibration routines and wherein performing the next calibration comprises performing a second number of calibrations that is less than the first number.

8. The method as recited in claim 1, wherein the method further comprises performing a first calibration at an operating point in which on-die termination is active and a second calibration at an operating point in which on-die termination is not active.

9. An apparatus comprising:
a memory;
a memory controller coupled to convey a data strobe to the memory and further configured to write data to and read data from the memory, wherein the memory controller includes a calibration control unit configured to:
perform a plurality of calibrations of a memory subsystem at each of a plurality of operating points, wherein each of the plurality of calibrations includes calibrating timing of a data strobe signal conveyed from a memory controller to a memory in the memory subsystem and calibrating a reference voltage;
save calibration state data for each of the plurality of calibrations, wherein each calibration state includes the delay of the data strobe signal and the reference voltage for the corresponding one of the plurality of operating points; and
set, responsive to changing to a given one of the plurality of operating points, the delay of the data strobe signal and the reference voltage to respective values of the calibration state corresponding to the given one of the plurality of operating point;
wherein the calibration control unit is further configured to, during normal operation, perform a next calibration responsive to entry into a new operating point, wherein, during the next calibration, the calibration control unit is configured to calibrate a subset of parameters that was calibrated during a corresponding one of the plurality of calibrations.

10. The apparatus as recited in claim 9, wherein the memory controller is configured to, during each of the plurality of calibrations, perform a corresponding plurality of writes of data to memory and a corresponding plurality of reads of data from memory.

11. The apparatus as recited in claim 9, wherein the calibration control unit is configured to calibrate a delay applied to the data strobe signal.

12. The apparatus as recited in claim 11, wherein, during calibration of the delay applied to the data strobe signal, the calibration control unit is configured to determine a delay locked loop code.

13. The apparatus as recited in claim 9, wherein the reference voltage is a voltage used to distinguish between a logic zero from a logic one in data read from the memory by the memory controller.

14. The apparatus as recited in claim 9, wherein the calibration control unit is configured to perform at least one of the plurality of calibrations at an operating point in which on-die termination is active, and at least one other one of the plurality of calibrations in which on-die termination is not active.

15. A method comprising:
   performing initial calibrations of a memory subsystem at each of a plurality of performance states, the memory subsystem including a memory and a memory controller, wherein performing the initial calibrations includes calibrating a plurality of parameters associated with transfers of data between the memory controller and the memory;
   saving results of each of the initial calibrations;
   responsive to changing to a new performance state during normal operation, setting each of the plurality of parameters to calibrated values obtained from performance of a corresponding on of the initial calibrations; and
   performing a next calibration subsequent to entering the new performance state during normal operation, wherein the next calibration comprises calibrating a subset of the plurality of parameters for which calibration was performed during each of the initial calibrations.

16. The method as recited in claim 15, wherein a first one of the initial calibrations corresponds to first one of the plurality of performance states in which on-die termination is active, and wherein a second one of the initial calibrations corresponds to a second one of the plurality of performance states in which on-die termination is not active.

17. The method as recited in claim 15, wherein performing the initial calibrations includes calibrating a delay applied to a data strobe conveyed from the memory controller to the memory and a reference voltage used to distinguish a logic zero from a logic one in data ready from the memory.

* * * * *